United States Patent
Wang et al.

(10) Patent No.: US 9,628,103 B2
(45) Date of Patent: Apr. 18, 2017

(54) MULTI-MODE DISCRETE-TIME DELTA-SIGMA MODULATOR POWER OPTIMIZATION USING SPLIT-INTEGRATOR SCHEME

(71) Applicant: QUALCOMM Incorporated, San Diego, CA (US)

(72) Inventors: Yan Wang, San Diego, CA (US); Dinesh Jagannath Alladi, San Diego, CA (US); Chieh-Yu Hsieh, Irvine, CA (US); Elias Hani Dagher, Aliso Viejo, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/639,534

(22) Filed: Mar. 5, 2015

(65) Prior Publication Data

US 2016/0261277 A1    Sep. 8, 2016

(51) Int. Cl.
   *H03M 3/00*    (2006.01)

(52) U.S. Cl.
   CPC ............ *H03M 3/32* (2013.01); *H03M 3/354* (2013.01); *H03M 3/496* (2013.01); *H03M 3/392* (2013.01); *H03M 3/45* (2013.01); *H03M 3/454* (2013.01)

(58) Field of Classification Search
   CPC ........ H03M 3/32; H03M 3/496; H03M 3/354; H03M 3/62; H03M 3/364; H03M 3/366; H03M 3/424; H03M 3/452
   USPC .................................. 341/143, 155
   See application file for complete search history.

(56) References Cited

U.S. PATENT DOCUMENTS

| | | | |
|---|---|---|---|
| 5,134,401 A | 7/1992 | McCartney et al. | |
| 5,585,801 A * | 12/1996 | Thurston | H03M 3/366 341/143 |
| 6,087,969 A * | 7/2000 | Stockstad | H03M 3/394 341/143 |
| 6,873,276 B2 | 3/2005 | Yang et al. | |
| 7,123,177 B2 * | 10/2006 | Cheng | H03M 3/444 341/143 |
| 7,312,734 B2 * | 12/2007 | McNeill | H03M 1/1004 341/120 |

(Continued)

OTHER PUBLICATIONS

Chen F.C., et al., "Design Optimization of Discrete-time Single-Loop Sigma-Delta ADCs via Nonideality and Power Analyses," WSEAS Transactions on Circuits and Systems, Jul. 2008, vol. 7 (7), pp. 770-787.

(Continued)

*Primary Examiner* — Khai M Nguyen
(74) *Attorney, Agent, or Firm* — Arent Fox LLP

(57) ABSTRACT

A method and an apparatus for splitting a switched capacitor integrator of a delta-sigma modulator are provided. The apparatus configures a first integrator and a second integrator to be coupled in parallel to each other, switches between a first mode and a second mode, enables the first integrator to operate on an input signal to generate an output signal in the first mode, and enables the first integrator and the second integrator to cooperatively operate on the input signal in the second mode, wherein in the second mode, the apparatus generates a first output via the first integrator, generates a second output via the second integrator, and converges the first output with the second output to generate the output signal.

29 Claims, 8 Drawing Sheets

(56) References Cited

U.S. PATENT DOCUMENTS

| | | | |
|---|---|---|---|
| 7,450,045 B2 * | 11/2008 | Liu | H03M 3/474 |
| | | | 341/143 |
| 7,911,256 B2 * | 3/2011 | Venkataraman | H03F 1/083 |
| | | | 327/337 |
| 8,130,127 B1 | 3/2012 | Tsang et al. | |
| 8,704,581 B2 | 4/2014 | Mathe | |
| 2006/0049970 A1 * | 3/2006 | Reefman | H03M 3/394 |
| | | | 341/143 |
| 2014/0070972 A1 | 3/2014 | Morgado et al. | |

OTHER PUBLICATIONS

Deligoz I., et al., "A MEMS-Based Power-Scalable Hearing Aid Analog Front End," IEEE Transactions on Biomedical Circuits and Systems, 2011, vol. 5, No. 3, pp. 201-213, XP011386711, ISSN: 1932-4545, DOI: 10.1109/ TBCAS.2010.2079329 Section IV; figures 19, 14.

International Search Report and Written Opinion—PCT/US2016/016853—ISA/EPO—May 27, 2016.

McNeill J., et al., "A Split-ADC Architecture for Deterministic Digital Background Calibration of a 16b 1MS/S ADC," Digest of Technical Papers, IEEE International Solid-State Circuits Conference, Feb. 8, 2005, pp. 276-277 & 598.

* cited by examiner

MULTI-MODE DISCRETE-TIME DELTA-SIGMA MODULATOR POWER OPTIMIZATION USING SPLIT-INTEGRATOR SCHEME

BACKGROUND

Field

The present disclosure relates generally to electronic circuit designs, and more particularly, to an apparatus and method related to analog-to-digital converters and delta-sigma modulators.

Background

Delta-sigma modulators and other types of analog-to-digital converters (ADCs) are widely used in communication systems and in many other applications. In communication systems, for example, such devices may be used to convert an intermediate frequency (IF) signal to a baseband frequency signal, in order to meet dynamic range requirements for digital signal processing, and to provide improved adaptability and programmability to receiver circuitry. The advantages of delta-sigma modulators include high dynamic range, which is often needed to distinguish a small desired signal from blockers and interferers. Delta-sigma modulators shape the quantization noise out-of-band, and allow combining decimation filtering with selective digital filtering and IF mixing to attenuate both the quantization noise and neighboring blockers. In addition, the ability to select different sampling rates in the delta-sigma modulator architecture allows a single device to be adapted to different requirements, for example, the requirements imposed by multiple RF standards. Moreover, the use of higher sampling rates and complex digital signal processing allow delta-sigma converters to exhibit relatively low sensitivity to interfering analog signals.

One-over-f (1/f) noise is one type of noise at the output of a typical converter (which word herein applies to delta-sigma modulators and ADCs). One-over-f noise is difficult to reduce because it lies in the same band as the converted signal, making it difficult to filter the noise out of the converted signal. Generally, reducing such noise is costly in terms of chip area and power consumption.

Size, power consumption, speed, signal-to-noise (SNR), and production costs loom large in designing electronic equipment, and especially portable battery-operated electronic equipment such as wireless access terminals. Therefore, there is a need in the art to improve SNR and reduce the power consumption of electronic equipment, including delta-sigma modulators and ADCs. There is also a need in the art to decrease size and weight of electronic equipment, including delta-sigma modulators and ADCs. There is a further need in the art to lower the cost of manufacturing electronic equipment, including delta-sigma modulators and other devices that include integrators and summers.

SUMMARY

In an aspect of the disclosure, a method and an apparatus for splitting a switched capacitor integrator of a delta-sigma modulator are provided. The apparatus is configured to couple a first integrator and a second integrator in parallel to each other. The apparatus is further configured to switch between a first mode and a second mode. In the first mode, the apparatus is configured to enable the first integrator to operate on an input signal to generate an output signal. In the second mode, the apparatus is configured to enable the first integrator and the second integrator to cooperatively operate on the input signal. In the second mode, the apparatus is configured to generate a first output via the first integrator, generate a second output via the second integrator, and converge the first output with the second output to generate the output signal.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

In an aspect, a discrete-time delta-sigma modulator may be extensively used for a multi-mode baseband transceiver system. To accommodate different noise requirements of different multi-mode standards, a switched-capacitor modulator may be designed to account for the most stringent specifications across different modes (e.g., GSM, WCDMA, LTE, etc.). Consequently, the modulator may potentially be over-designed for certain modes. For a narrow-band application, such as a GSM mode, KT/C noise and flicker noise are both dominant noise sources for a single receiving band (RB) close to DC. For a wide-band application, such as a LTE 20M mode, KT/C noise density is reduced significantly with a higher sampling frequency to meet an edge RB noise requirement. Hence, more flicker noise may be tolerated for a low frequency RB.

Figure 1:
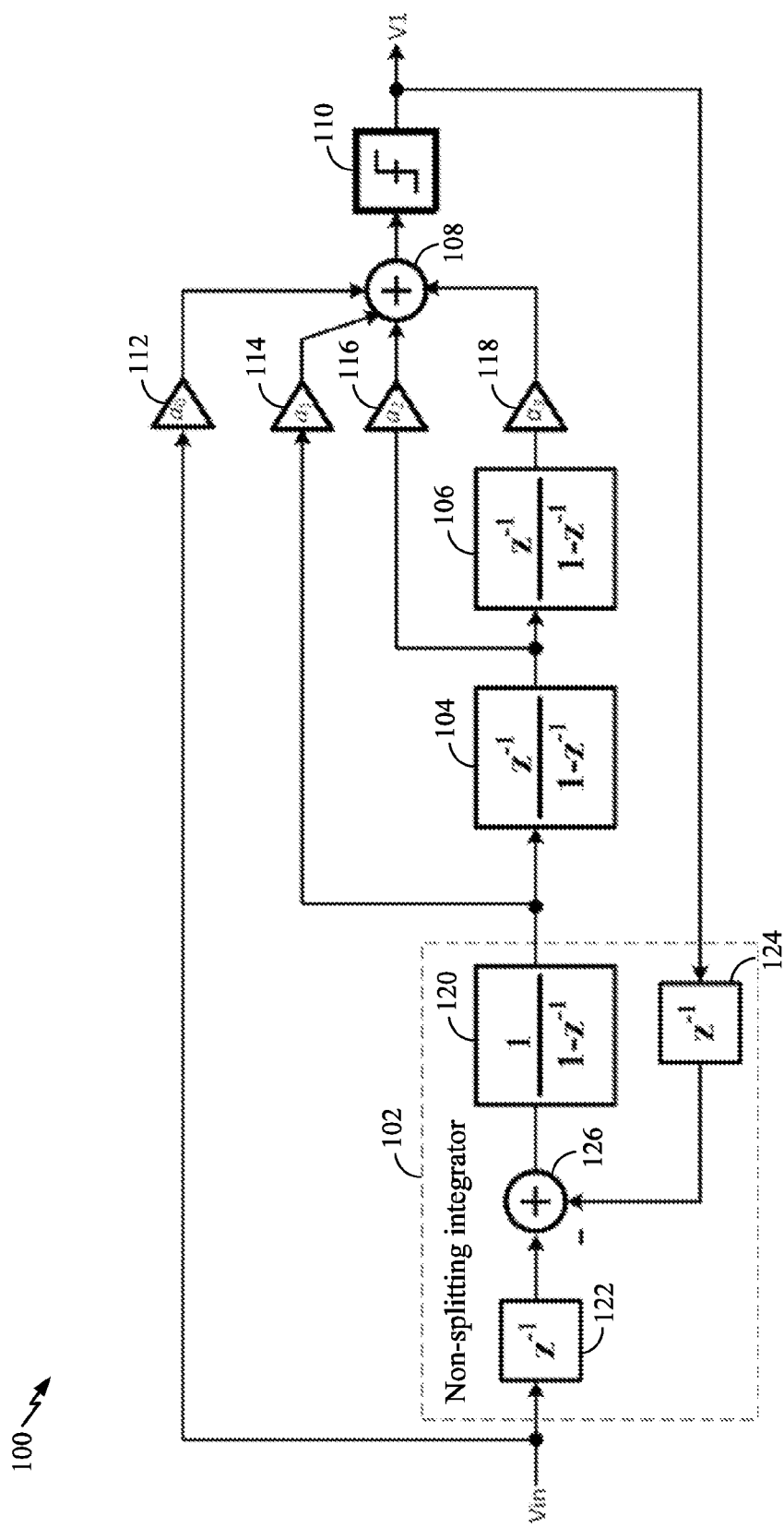
FIG. 1 illustrates a delta-sigma modulator using a non-splitting integrator.

FIG. 1 illustrates a delta-sigma modulator 100 using a non-splitting integrator. The delta-sigma modulator 100 may be used in a current baseband receiver (BBRx) design and may include a first (non-splitting) integrator 102, a second integrator 104, and a third integrator 106. The delta-sigma modulator 100 may further include a summer 108, a quantizer 110, and scaling block paths 112, 114, 116, and 118. Output V1 is generated from the quantizer 110.

In an aspect, the first (non-splitting) integrator 102 may include an integrator 120, a first delay cell 122, a second delay cell 124, and a summer 126. In an example implementation, the first delay cell 122 receives Vin as an input. An output of the first delay cell 122 is applied to the summer 126. The second delay cell 124 receives V1 as an input. An output of the second delay cell 124 is applied to the summer 126. The summer 126 receives as inputs the output from the first delay cell 122 and the output from the second delay cell 124. An output of the summer 126 is applied to the integrator 120. An output of the integrator 120 may then be applied to the scaling block path 114 and the second integrator 104.

In a current BBRx design, an operational amplifier (op-amp) of the first integrator 102 may be designed with low-flicker noise and fast settling to meet noise and stability requirements across different modes (e.g., GSM, WCDMA, LTE, etc.). For example, power optimization in a narrow-band mode (e.g., GSM mode) may not necessarily be optimal for a wide-band mode (e.g., LTE 40 mode). In the wide-band mode, an analog-to-digital converter (ADC) runs faster to keep an ADC quantization noise (Qnoise) low. Moreover, a high sampling frequency (Fs) also unnecessarily reduces KT/C noise density to a certain extent. The KT/C noise may be increased by scaling down a capacitor size, which can reduce power without increasing the Qnoise. With such ability for reconfiguration, an op-amp current may also be scaled down with relaxed noise budgets across modes.

In an aspect, an example approach for power reduction includes linearly scaling an operational transconductance amplifier (OTA) bias current with a sampling frequency (Fs). Another example of a power reduction approach includes increasing a front-end gain with relaxed noise specifications for a circuit, such as a voltage doubler. A further example of a power reduction approach includes scaling a size of OTA differential pairs, which may reduce input pair parasitic capacitance but may not change routing and capacitor loading.

Figure 2:
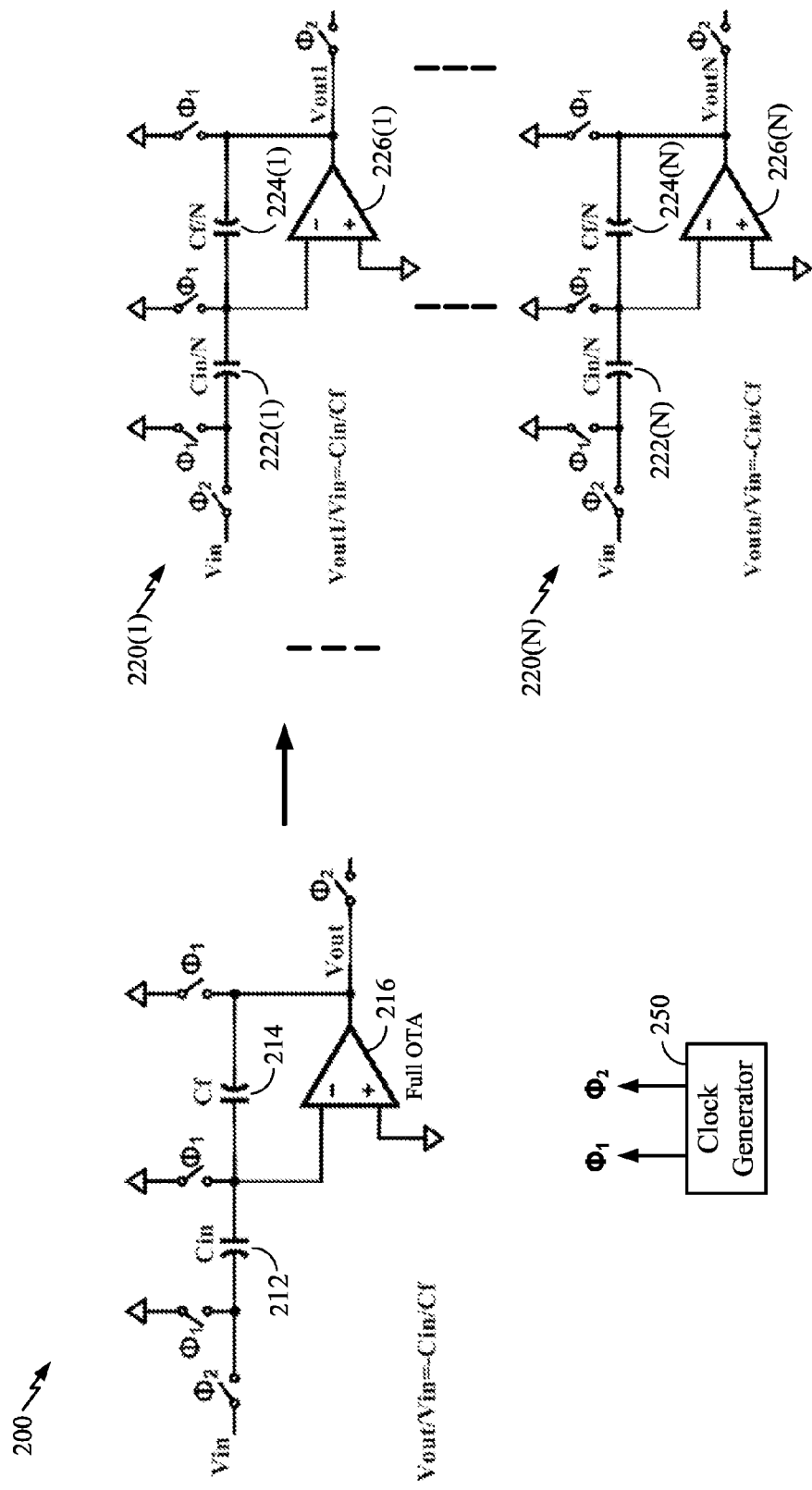
FIG. 2 illustrates selected components of a switched-capacitor gain stage.

FIG. 2 illustrates selected components of a switched-capacitor amplifier (gain stage) 200. The switched-capacitor gain stage 200 may include a sampling capacitor Cin 212, a feedback capacitor Cf 214, and an OTA 216. A clock generator 250 is configured to generate phases $\Phi_1$ and $\Phi_2$ of a sampling clock. In an aspect, the delay or phase difference between $\Phi_1$ and $\Phi_2$ is asynchronous. At the same time, $\Phi_1$ and $\Phi_2$ are different phases of the same sampling clock, and therefore operate at the same frequency.

In an aspect, the sampling capacitor Cin 212 and the feedback capacitor Cf 214 may be scaled by the same ratio in order to split the switched-capacitor gain stage 200 into multiple parallel gain stages 220(1) to 220(N) having the same transfer function as the gain stage 200. Switches denoted by $\Phi_1$ in the gain stage 200 or the multiple parallel gain stages 220 are turned on (closed) by one phase of the sampling clock being active, wherein the two phases of the sampling clock are non-overlapping. Switches denoted by $\Phi_2$ in the gain stage 200 or the multiple parallel gain stages 220 are turned on (closed) by a second phase of the sampling clock being active.

In an aspect, the multiple parallel gain stages 220(1) to 220(N) cooperatively operate on an input signal Vin to generate an output signal Vout. For example, each of the gain stages 220(1) to 220(N) may generate, based on the input signal Vin, outputs Vout1 to VoutN, respectively. Thereafter, the outputs Vout1 to VoutN may converge to generate the output signal Vout.

In an aspect, each gain stage (220(1) to 220(N) includes an operational transconductance amplifier (OTA) (e.g., OTA 226(1), . . . , OTA 226(N)), a sampling capacitor (e.g., capacitor 222(1), . . . , capacitor 222(N)) having a positive terminal coupled to a source of the input signal Vin through a switch denoted by $\Phi_2$ and a negative terminal coupled to an inverting input of the respective OTA, and a feedback capacitor (e.g., capacitor 224(1), . . . , 224(N)) having a positive terminal coupled to an output of the respective OTA and a negative terminal coupled to the inverting input of the respective OTA.

As shown in FIG. 2, the gain stage 200 and each of the multiple parallel gain stages 220 include a single input branch for receiving the input Vin. However, in other aspects of the present disclosure, the scheme for splitting the gain stage 200 may also be applied when the gain stage 200 includes multiple input branches such that each of the multiple parallel gain stages 220 will also have multiple input branches. Moreover, although the gain stage 200 and the multiple parallel gain stages 220 are depicted as single-ended circuit structures, the gain stage 200 and the multiple parallel gain stages 220 may also be implemented as differential circuit structures. In an aspect, the scheme for splitting the switched-capacitor gain stage 200 may also be applied to various other devices, such as a switched-capacitor integrator or a continuous-time delta-sigma analog-to-digital converter (ADC), for example.

Figure 3:
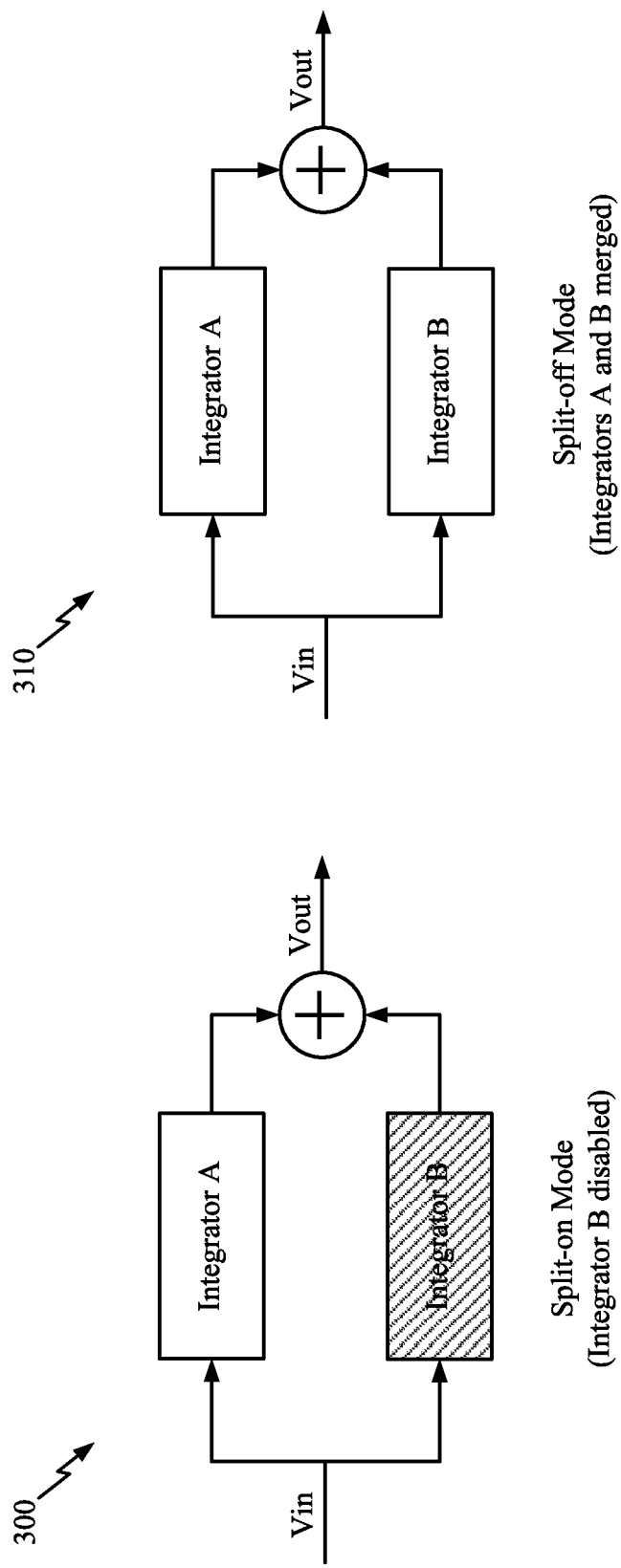
FIG. 3 illustrates modes of a split-integrator scheme.

FIG. 3 illustrates modes 300 and 310 of a split-integrator scheme. In the split-integrator scheme, an integrator may be split into a number of sub-integrators (e.g., two sub-integrators). In an aspect, the sub-integrators may be merged together to operate as a single integrator, or a sub-integrator may be solely enabled for operation, depending on a desired mode of operation. The split-integrator scheme may be implemented in a delta-sigma modulator of the present disclosure.

As shown in FIG. 3, in a split-on mode 300, a first sub-integrator (Integrator A) is enabled while a second sub-integrator (Integrator B) is disabled. In a split-off mode 310, both the Integrator A and the Integrator B are enabled to allow the two sub-integrators to operate as a single integrator system. In an aspect, if a low-power delta-sigma modulator mode is desired, the split-on mode 300 may be used such that only the Integrator A is enabled for operation. In another aspect, if a low-noise (e.g., reduced flicker and/or KT/C noise) delta-sigma modulator mode is desired, the split-off mode 310 may be used such that the Integrator A and the Integrator B are combined and operated as a single integrator system.

In an aspect, the split-on mode 300 may approximately achieve a 50% power reduction compared to the split-off mode 310. The split-integrator operation of FIG. 3 may be transparent to a quantizer, demodulator, or other digital modules of the delta-sigma modulator since these modules may not undergo a design change and may operate in a usual manner when switching from the split-off mode 310 to the split-on mode 300.

Figure 4A:
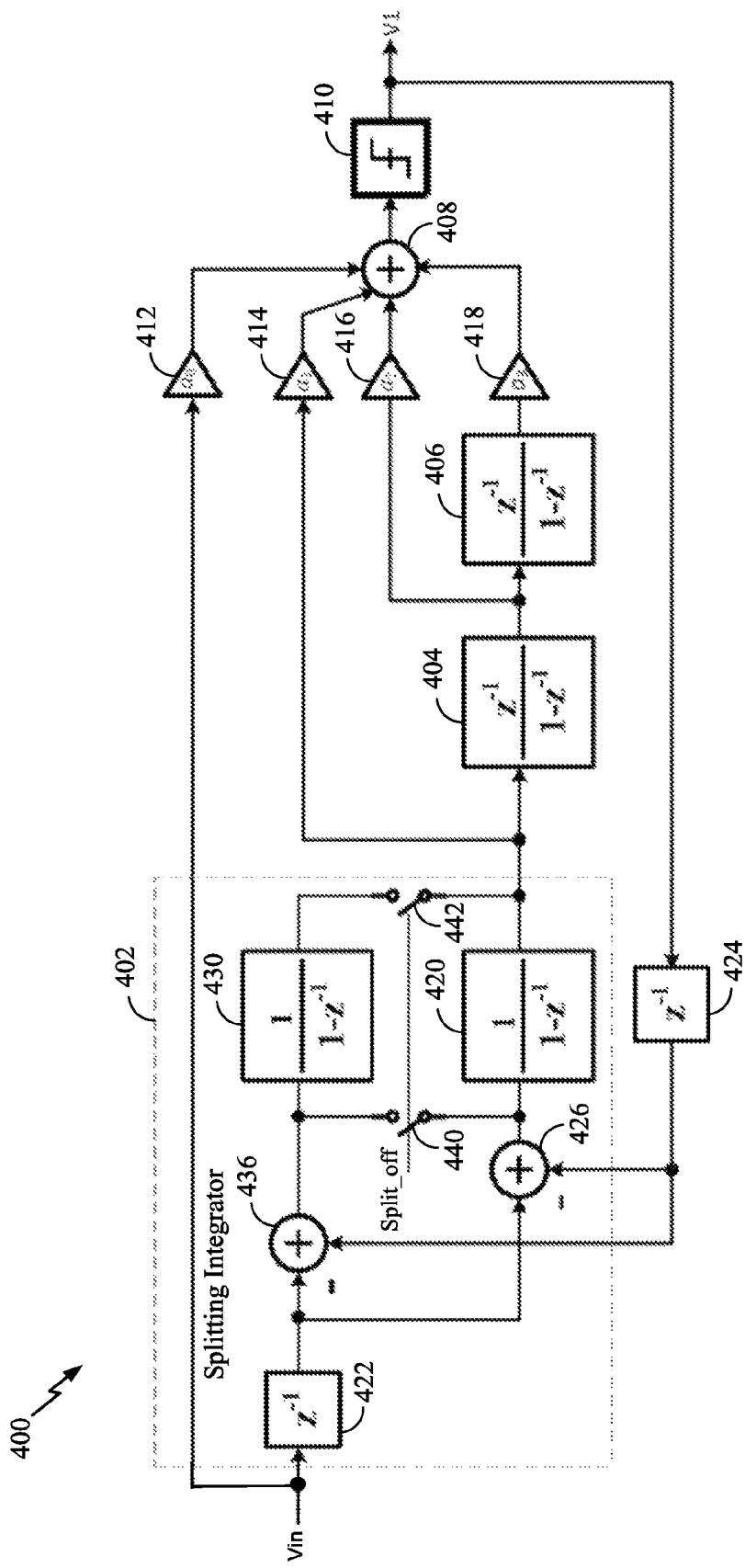
FIG. 4A illustrates a delta-sigma modulator implementing a split-integrator scheme.

FIG. 4A illustrates a delta-sigma modulator 400 implementing a split-integrator scheme. The delta-sigma modulator 400 may be used in a baseband receiver (BBRx) and may include a splitting integrator system 402, a second integrator 404, and a third integrator 406. The delta-sigma modulator 100 may further include a summer 408, a quantizer 410, and scaling block paths 412, 414, 416, and 418. Output V1 is generated from the quantizer 410.

In an aspect, the splitting integrator system 402 may include a first sub-integrator 420, a second sub-integrator 430, a first delay cell 422, and a second delay cell 424. The splitting integrator system 402 may further include switch 440 and/or switch 442 for switching between a split-on mode and a split-off mode. As described below, aspects of the splitting integrator system 402 are depicted to include the switch 442. However, in other aspects, the switch 442 is optional and may be removed without affecting split-integrator functionality. In an example implementation of the split-on mode, the switches 440 and 442 are turned off (open) such that only the first sub-integrator 420 is enabled. Accordingly, the first delay cell 422 receives Vin as an input. An output of the first delay cell 422 is applied to the first sub-integrator 420. The second delay cell 424 receives V1 as an input. An output of the second delay cell 424 is applied to the first sub-integrator 420. The first sub-integrator 420 receives as inputs the output from the first delay cell 422 and the output from the second delay cell 424. In an aspect, the output from the first delay cell 422 and the output from the second delay cell 424 are conceptually summed 426 as they are input to the first sub-integrator 420. An output of the first sub-integrator 420 may then be applied to the scaling block path 414 and the second integrator 404.

In an example implementation of the split-off mode, the switches 440 and 442 are turned on (closed) such that both the first sub-integrator 420 and the second sub-integrator 430 are enabled. The enabled first sub-integrator 420 and the enabled second sub-integrator 430 are connected in parallel and operate as a single integrator. Accordingly, the first delay cell 422 receives Vin as an input. An output of the first delay cell 422 is applied to the first sub-integrator 420 and the second sub-integrator 430. The second delay cell 424 receives V1 as an input. An output of the second delay cell 424 is applied to the first sub-integrator 420 and the second sub-integrator 430. The first sub-integrator 420 receives as inputs the output from the first delay cell 422 and the output from the second delay cell 424. In an aspect, the output from the first delay cell 422 and the output from the second delay cell 424 are conceptually summed 426 as they are input to the first sub-integrator 420. The second sub-integrator 430 receives as inputs the output from the first delay cell 422 and the output from the second delay cell 424. In an aspect, the output from the first delay cell 422 and the output from the second delay cell 424 are conceptually summed 436 as they are input to the second sub-integrator 430. An output of the first sub-integrator 420 converges with an output of the second sub-integrator 430. The converged outputs of the first sub-integrator 420 and the second sub-integrator 430 may then be applied to the scaling block path 414 and the second integrator 404.

As described above, the splitting integrator system 402 of FIG. 4A includes two input branches for receiving the inputs Vin and V1, respectively. However, in other aspects of the present disclosure, the splitting integrator system 402 may include multiple input branches (e.g., three or more input branches) for receiving multiple inputs (e.g., three or more inputs), respectively. Accordingly, the splitting integrator system 402 may be configured to process the multiple inputs during a split-on mode and/or a split-off mode. Moreover, although the split integrator system 402 is described as a single-ended circuit structure, the split integrator system 402 may also be implemented as a differential circuit structure.

Figure 4B:
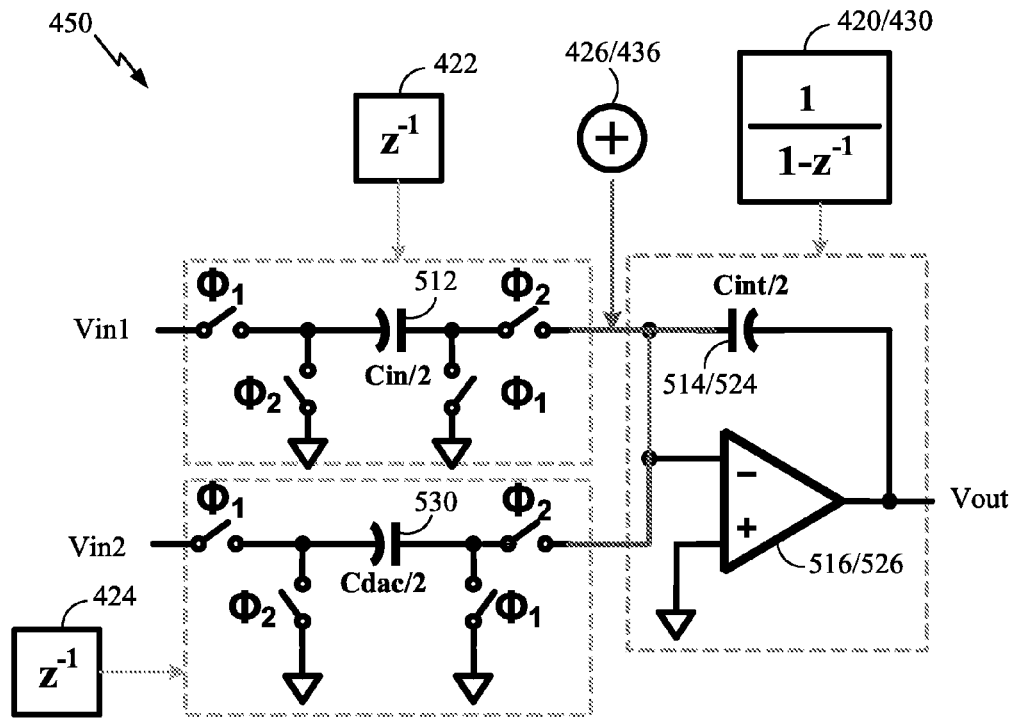
FIG. 4B shows diagrams illustrating an example correspondence between a circuit diagram and a block diagram for the split-integrator scheme of FIG. 4A.
Figure 4B:
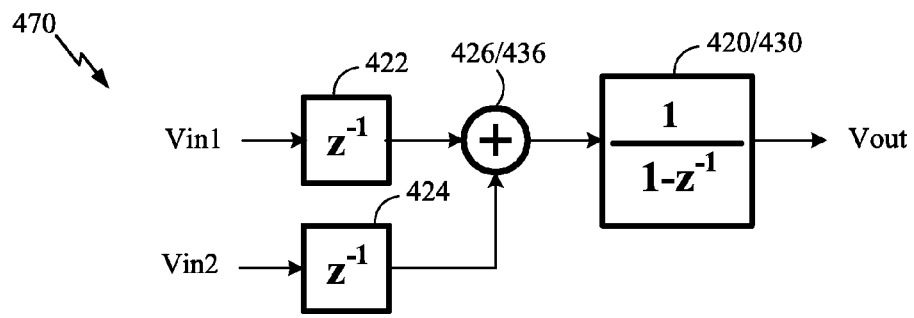
Figure 4B:
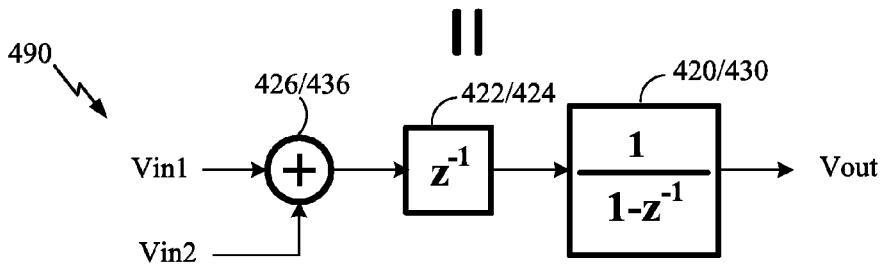

FIG. 4B shows diagrams 450, 470, and 490 illustrating an example correspondence between a circuit diagram and a block diagram for the split-integrator scheme of FIG. 4A. Referring to circuit diagram 450, the first delay cell 422 may include a sampling capacitor Cin/2 512 having a positive terminal coupled to a first input voltage (Vin1) source and a negative terminal coupled to an inverting input of an OTA 516/526. The positive terminal of the sampling capacitor Cin/2 512 may be coupled to the Vin1 source through a switch denoted by $\Phi_1$ and coupled to a ground node through a switch denoted by $\Phi_2$. The negative terminal of the sampling capacitor Cin/2 512 may be coupled to the inverting input of the OTA 516/526 through a switch denoted by $\Phi_2$ and coupled to a ground node through a switch denoted by $\Phi_1$.

Still referring to diagram 450, the second delay cell 424 may include a capacitor Cdac/2 530 having a positive terminal coupled to a second input voltage (Vin2) source and a negative terminal coupled to the inverting input of the OTA 516/526. The positive terminal of the capacitor Cdac/2 530 may be coupled to the Vin2 source through a switch denoted by $\Phi_1$ and coupled to a ground node through a switch denoted by $\Phi_2$. The negative terminal of the capacitor Cdac/2 530 may be coupled to the inverting input of the OTA 516/526 through a switch denoted by $\Phi_2$ and coupled to a ground node through a switch denoted by $\Phi_1$.

The sub-integrator 420/430 may include a feedback capacitor Cint/2 514/524. The feedback capacitor Cint/2 514/524 may have a positive terminal coupled to an output of the OTA 516/526 and a negative terminal coupled to the inverting input of the OTA 516/526.

In an aspect, the output of the first delay cell 422 is applied to the sub-integrator 420/430 by applying the output to the inverting input of the OTA 516/526. Similarly, the output of the second delay cell 424 is applied to the sub-integrator 420/430 by applying the output to the inverting input of the OTA 516/526. The output from the first delay cell 422 and the output from the second delay cell 424 may be conceptually summed (426/436) as they are applied to the inverting input of the OTA 516/526. Thereafter, the output (Vout) of the sub-integrator 420/430 may be applied to other modules, such as the scaling block path 414 and the second integrator 404 of FIG. 4A.

Diagrams 470 and 490 illustrate block diagrams that are equivalent to the circuit diagram 450. Referring to block diagram 470, the first delay cell 422, the second delay cell 424, and the sub-integrator 420/430 are depicted in a simplified manner without showing the switches, capacitors, and/or OTA described above.

Referring to block diagram 490, the split integrator scheme may be further simplified. For example, the first delay cell 422 and the second delay cell 424 may be replaced by a single delay cell 422/424. The single delay cell 422/424 receives as input a sum (426/436) of the Vin1 source and the Vin2 source. Moreover, an output of the single delay cell 422/424 is directly applied to the sub-integrator 420/430. Thereafter, the output (Vout) of the sub-integrator 420/430 may be applied to other modules, such as the scaling block path 414 and the second integrator 404 of FIG. 4A.

As described above, the split-integrator scheme shown in FIG. 4B includes two input branches for receiving the inputs Vin1 and Vin2, respectively. However, in other aspects of the present disclosure, the split-integrator scheme may include multiple input branches (e.g., three or more input branches) for receiving multiple inputs (e.g., three or more inputs), respectively. Accordingly, the split-integrator scheme may be configured to process the multiple inputs to produce a single output (Vout). Moreover, although the split integrator scheme of FIG. 4B is depicted as a single-ended circuit structure, the split integrator scheme of FIG. 4B may also be implemented as a differential circuit structure.

As described above, the split-integrator schemes of FIGS. 4A and 4B are implemented with respect to a first integrator (e.g., splitting integrator system 402) of the delta-sigma modulator 400. However, it is contemplated that the split-integrator scheme may alternatively (and/or additionally) be implemented with respect to the second integrator 404, the third integrator 406, or any other integrator of the delta-sigma modulator 400.

Figure 5:
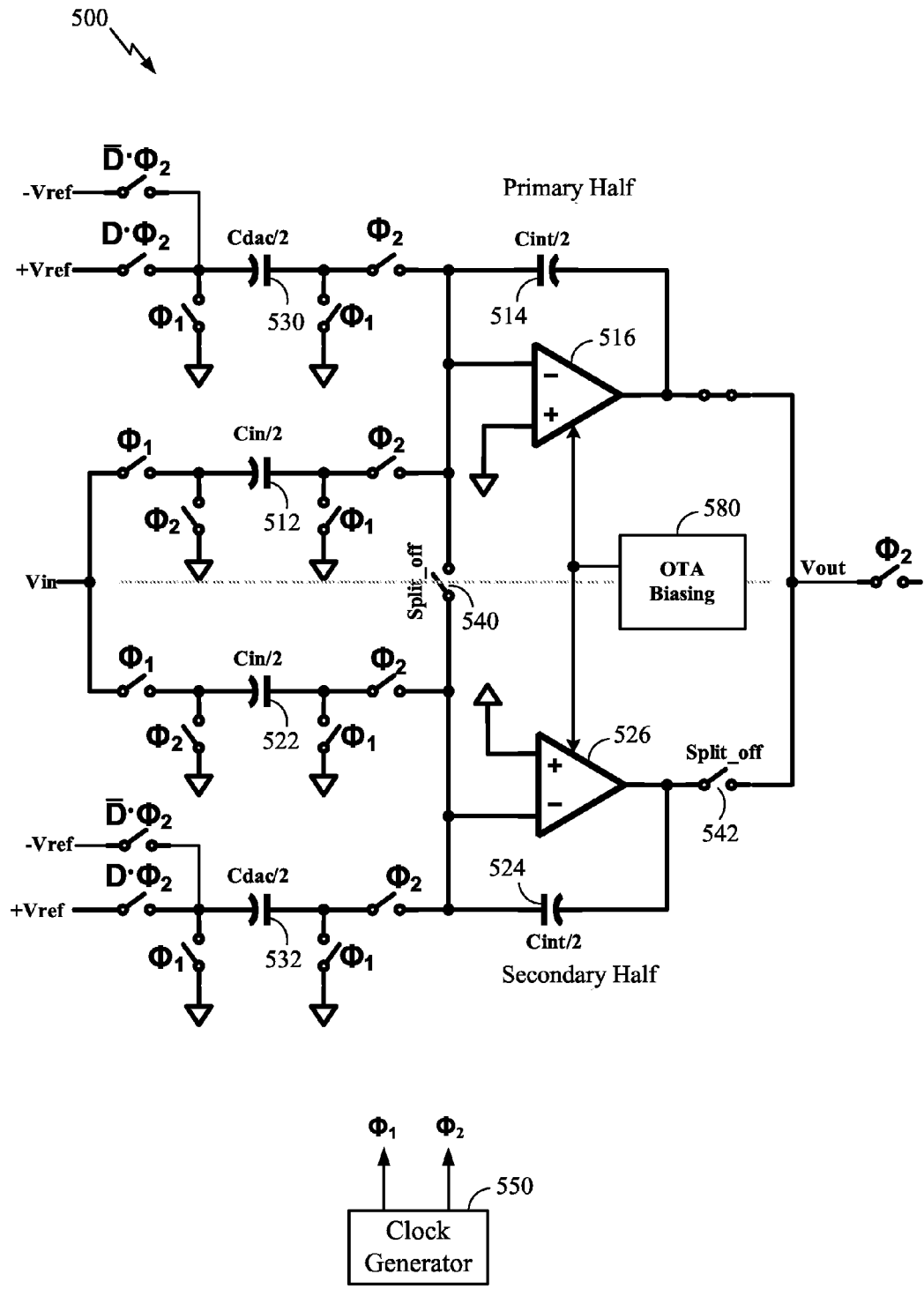
FIG. 5 is a circuit diagram illustrating a split-integrator scheme.

FIG. 5 is a circuit diagram 500 illustrating a split-integrator scheme. According to the split-integrator scheme, a number of capacitors, OTAs, and switches are implemented to provide two half integrator instances: a primary half integrator and a secondary half integrator. In general, during a split-off mode (e.g., when the switches 540 and 542 are turned on (closed) such that both the primary half integrator and the secondary half integrator are enabled), the OTA biasing 580 and a common mode feedback block (CMFB) will be shared between the primary half integrator and the secondary half integrator. The circuit diagram 500 depicting the primary half integrator and the secondary half integrator may provide detail to the splitting integrator system 402 of FIG. 4A.

In an aspect, the primary half integrator includes a sampling capacitor Cin/2 512 having a positive terminal coupled to an input voltage (Vin) source and a negative terminal coupled to an inverting input of a first OTA 516. The positive terminal of the sampling capacitor Cin/2 512 may be coupled to the Vin source through a switch denoted by $\Phi_1$ and coupled to a ground node through a switch denoted by $\Phi_2$. The negative terminal of the sampling capacitor Cin/2 512 may be coupled to the inverting input of the first OTA 516 through a switch denoted by $\Phi_2$ and coupled to a ground node through a switch denoted by $\Phi_1$. The primary half integrator may further include a capacitor Cdac/2 530 having a positive terminal coupled to a negative reference voltage (−Vref) source and a positive reference voltage (+Vref) source, and a negative terminal coupled to the inverting input of the first OTA 516. The positive terminal of the capacitor Cdac/2 530 may be coupled to the +Vref source through a switch denoted by $D \cdot \Phi_2$, coupled to the −Vref source through a switch denoted by $\overline{D} \cdot \Phi_2$, and coupled to a ground node through a switch (denoted by $\Phi_1$). The negative terminal of the capacitor Cdac/2 530 may be coupled to the inverting input of the first OTA 516 through a switch denoted by $\Phi_2$ and coupled to a ground node through a switch denoted by $\Phi_1$. The capacitor Cdac/2 530 may form part of the first sub-integrator 420, and/or a digital to analog converter (DAC) associated with the splitting integrator system 402. The primary half integrator also includes a feedback capacitor Cint/2 514 having a positive terminal coupled to an output of the first OTA 516 and a negative terminal coupled to the inverting input of the first OTA 516. The feedback capacitor Cint/2 514 may be a feedback capacitor for the first sub-integrator 420.

In a further aspect, the secondary half integrator includes a sampling capacitor Cin/2 522 having a positive terminal coupled to the input voltage (Vin) source and a negative terminal coupled to an inverting input of a second OTA 526. The positive terminal of the sampling capacitor Cin/2 522 may be coupled to the Vin source through a switch denoted by $\Phi_1$ and coupled to a ground node through a switch denoted by $\Phi_2$. The negative terminal of the sampling capacitor Cin/2 522 may be coupled to the inverting input of the second OTA 526 through a switch denoted by $\Phi_2$ and coupled to a ground node through a switch denoted by $\Phi_1$. The secondary half integrator may further include a capacitor Cdac/2 532 having a positive terminal coupled to a negative reference voltage (−Vref) source and a positive reference voltage (+Vref) source, and a negative terminal coupled to the inverting input of the second OTA 526. The positive terminal of the capacitor Cdac/2 532 may be coupled to the +Vref source through a switch denoted by $D \cdot \Phi_2$, coupled to the −Vref source through a switch denoted by $\overline{D} \cdot \Phi_2$, and coupled to a ground node through a switch denoted by $\Phi_1$. The negative terminal of the capacitor Cdac/2 532 may be coupled to the inverting input of the second OTA 526 through a switch (denoted by $\Phi_2$) and coupled to a ground node through a switch denoted by $\Phi_1$. The capacitor Cdac/2 532 may form part of the second sub-integrator 430, and/or a digital to analog converter (DAC) associated with the splitting integrator system 402. The secondary half integrator also includes a feedback capacitor Cint/2 524 having a positive terminal coupled to an output of the second OTA 516 and a negative terminal coupled to the inverting input of the second OTA 516. The feedback capacitor Cint/2 524 may be a feedback capacitor for the second sub-integrator 430.

Still referring to FIG. 5, a clock generator 550 is configured to generate phases $\Phi_1$ and $\Phi_2$ of a sampling clock. In an aspect, the delay or phase difference between $\Phi_1$ and $\Phi_2$ is asynchronous. At the same time, $\Phi_1$ and $\Phi_2$ are different phases of the same sampling clock, and therefore operate at the same frequency. In an aspect, the capacitors Cin/2 512, Cdac/2 530, and Cint/2 514 of the primary half integrator and the capacitors Cin/2 522, Cdac/2 532, and Cint/2 524 of the secondary half integrator may be scaled by the same ratio. Switches denoted by $\Phi_1$ are turned on (closed) by one phase of the sampling clock being active, wherein the two phases of the sampling clock are non-overlapping. Switches denoted by $\Phi_2$ are turned on (closed) by the second phase of the sampling clock being active.

The split-integrator scheme of FIG. 5 may further include switches 540 and 542 for switching between a split-on mode and a split-off mode. The switches 540 and 542 may correspond to the switches 440 and 442 of FIG. 4A, respectively. A first end of the switch 540 may be coupled to the inverting input of the first OTA 516, the negative terminal of the sampling capacitor Cin/2 512, the negative terminal of the capacitor Cdac/2 530, and the negative terminal of the feedback capacitor Cint/2 514. A second end of the switch 540 may be coupled to the inverting input of the second OTA 526, the negative terminal of the sampling capacitor Cin/2 522, the negative terminal of the capacitor Cdac/2 532, and the negative terminal of the feedback capacitor Cint/2 524. A first end of the switch 542 may be coupled to an output of the first OTA 516 and a second end of the switch 542 may be coupled to an output of the second OTA 526.

In an example implementation of the split-on mode, the switches 540 and 542 are turned off (open) such that only the primary half integrator is enabled. Accordingly, the capacitors Cin/2 512, Cdac/2 530, and Cint/2 514, and the first OTA 516, operate according to the switching controlled by the phases $\Phi_1$ and $\Phi_2$ of the sampling clock. In particular, signals from the negative terminal of the sampling capacitor Cin/2 512, the negative terminal of the capacitor Cdac/2 530, and the negative terminal of the feedback capacitor Cint/2 514 converge at the inverting input of the first OTA 516. The first OTA 516 generates an output (Vout) based on the converged signals. Vout may then be applied to other elements of a delta-sigma modulator (e.g., scaling block path 414 and/or second integrator 404 of delta-sigma modulator 400).

In an example implementation of the split-off mode, the switches 540 and 542 are turned on (closed) such that both the primary half integrator and the secondary half integrator are enabled. The enabled primary half integrator and the enabled secondary half integrator are connected in parallel and operate as a single integrator. As mentioned above, during the split-off mode, the OTA biasing 580 and the common mode feedback block (CMFB) will be shared between the primary half integrator and the secondary half integrator. Accordingly, the capacitors Cin/2 512, Cdac/2 530, and Cint/2 514, the first OTA 516, the capacitors Cin/2 522, Cdac/2 532, and Cint/2 524, and the second OTA 526, operate according to the switching controlled by the phases $\Phi_1$ and $\Phi_2$ of the sampling clock. In particular, signals from the negative terminal of the sampling capacitor Cin/2 512, the negative terminal of the capacitor Cdac/2 530, the negative terminal of the feedback capacitor Cint/2 514, the negative terminal of the sampling capacitor Cin/2 522, the negative terminal of the capacitor Cdac/2 532, and the negative terminal of the feedback capacitor Cint/2 524 converge at the inverting input of the first OTA 516. Moreover, the signals from the negative terminal of the sampling capacitor Cin/2 512, the negative terminal of the capacitor Cdac/2 530, the negative terminal of the feedback capacitor Cint/2 514, the negative terminal of the sampling capacitor Cin/2 522, the negative terminal of the capacitor Cdac/2 532, and the negative terminal of the feedback capacitor Cint/2 524 converge at the inverting input of the second OTA 526. The first OTA 516 generates a first output based on the converged signals. The second OTA 526 generates a second output based on the converged signals. The output of the first OTA 516 converges with the output of the second OTA 526 to generate Vout. Vout may then be applied to other elements of the delta-sigma modulator (e.g., scaling block path 414 and/or second integrator 404 of delta-sigma modulator 400).

As described above, the split-integrator scheme of FIG. 5 includes two input branches for receiving two inputs (e.g., the input Vin and the input Vref), respectively. However, in other aspects of the present disclosure, the split-integrator scheme may include multiple input branches (e.g., three or more input branches) for receiving multiple inputs (e.g., three or more inputs), respectively. Accordingly, the split-integrator scheme of FIG. 5 may be configured to process the multiple inputs during a split-on mode and/or a split-off mode. Moreover, although aspects of the split integrator scheme of FIG. 5 are depicted as a single-ended circuit structure, such aspects of the split integrator scheme of FIG. 5 may also be implemented as a differential circuit structure.

Figure 6:
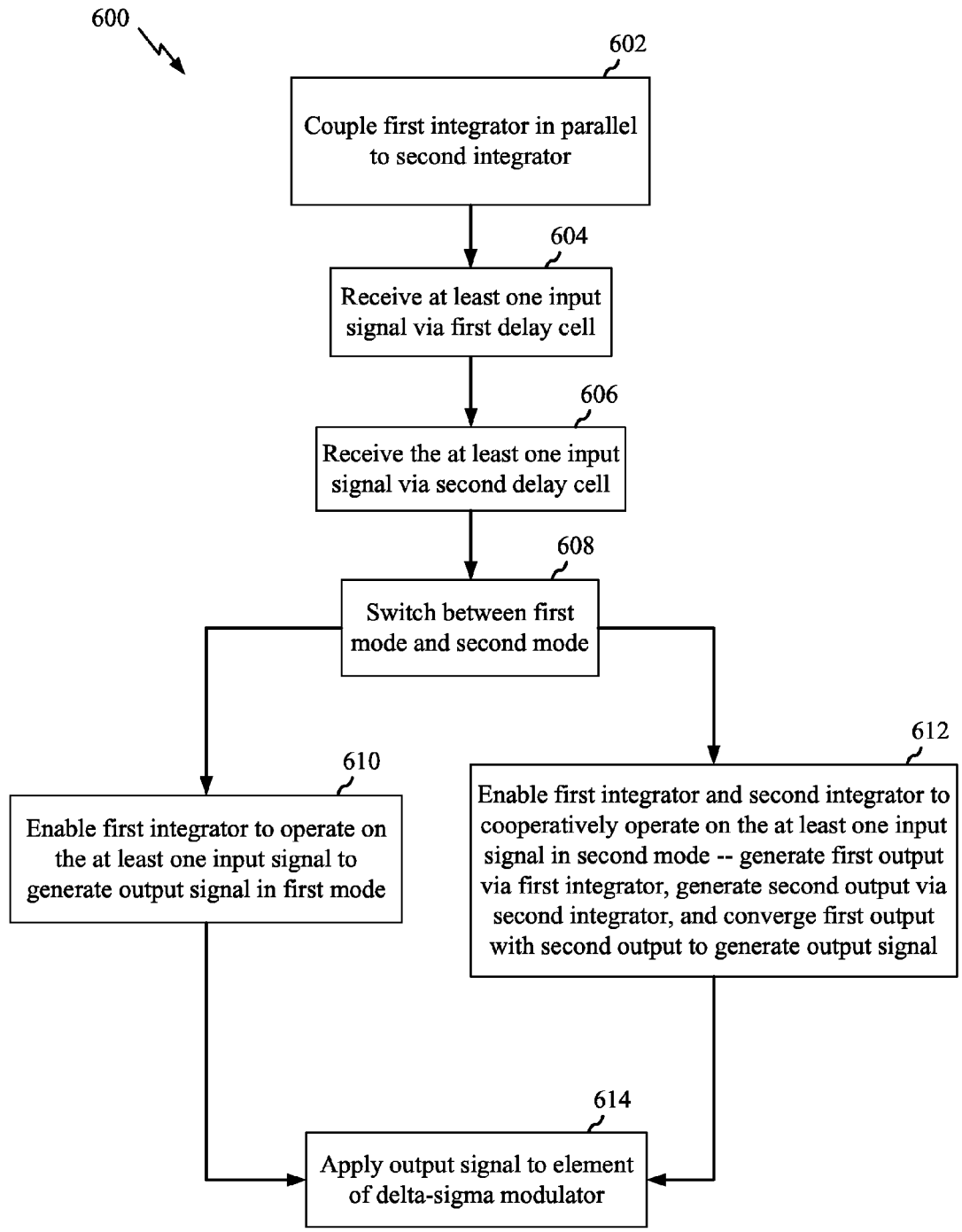
FIG. 6 is a flow chart of a method for splitting a switched capacitor integrator of a delta-sigma modulator.

FIG. 6 is a flow chart 600 of a method for splitting a switched capacitor integrator of a delta-sigma modulator. The method may be performed by an apparatus (e.g., a delta-sigma modulator 400 of a baseband receiver) via one or more of the structural elements described above with respect to FIGS. 4A, 4B, and 5.

At block 602, the apparatus couples a first integrator in parallel to a second integrator. At block 604, the apparatus receives, via a first delay cell (e.g., first delay cell 422), at least one input signal. At block 606, the apparatus receives, via a second delay cell (e.g., second delay cell 424), the at least one input signal. As an example, the at least one input signal may be the input Vin/Vin1 and/or the input V1/Vin2/Vref of FIG. 4A, 4B, or 5. The first integrator may be configured to receive at least one of an output of the first delay cell or an output of the second delay cell. Similarly, the second integrator may be configured to receive the at least one of the output of the first delay cell or the output of the second delay cell.

At block 608, the apparatus switches (e.g., via switches 440 and/or 442) between a first mode (e.g., split-on mode) and a second mode (e.g., split-off mode). When switching to the first mode, the apparatus may proceed to block 610. Otherwise, the apparatus may proceed to block 612 when switching to the second mode.

At block 610, the apparatus enables the first integrator to operate on the at least one input signal to generate an output signal in the first mode. In an aspect, in the first mode, the first integrator is configured to generate the output signal based on the output of the first delay cell.

At block 612, the apparatus enables the first integrator and the second integrator to cooperatively operate on the at least one input signal in the second mode. In the second mode, the apparatus generates a first output via the first integrator, generates a second output via the second integrator, and converges the first output with the second output to generate the output signal. In an aspect, in the second mode, the first integrator is configured to generate the first output based on the output of the first delay cell and the output of the second delay cell, and the second integrator is configured to generate the second output based on the output of the first delay cell and the output of the second delay cell.

At block 614, the apparatus applies the output signal generated via the first mode (block 610) or the second mode (block 12) to at least one element of the delta-sigma modulator.

In an aspect, the first integrator includes a first operational transconductance amplifier (OTA) (e.g. OTA 516) and a first feedback capacitor (e.g., capacitor 514) having a positive terminal coupled to an output of the first OTA and a negative terminal coupled to an inverting input of the first OTA. The first delay cell includes a first sampling capacitor (e.g., capacitor 512) having a positive terminal coupled to a source of a first input signal (e.g., Vin) of the at least one input signal and a negative terminal coupled to the inverting input of the first OTA. The first delay cell further includes a second sampling capacitor (e.g., capacitor 530) having a positive terminal coupled to a source of a second input signal (e.g., Vref) of the at least one input signal and a negative terminal coupled to the inverting input of the first OTA. The second integrator includes a second OTA (e.g., OTA 526), and a second feedback capacitor (e.g., capacitor 524) having a positive terminal coupled to an output of the second OTA and a negative terminal coupled to an inverting input of the second OTA. The second delay cell includes a third sampling capacitor (e.g., capacitor 522) having a positive terminal coupled to the source of the first input signal (e.g., Vin) of the at least one input signal and a negative terminal coupled to the inverting input of the second OTA. The second delay cell further includes a fourth sampling capacitor (e.g., capacitor 532) having a positive terminal coupled to a source of the second input signal (e.g., Vref) of the at least one input signal and a negative terminal coupled to the inverting input of the second OTA.

In a further aspect, the positive terminal of the first sampling capacitor is coupled to the source of the first input signal through a first switch of a first type (e.g., first switch type turned on by $\Phi_1$) and coupled to a ground node through a second switch of a second type (e.g., second switch type turned on by $\Phi_2$). The negative terminal of the first sampling capacitor is coupled to the inverting input of the first OTA through a third switch of the second type and coupled to a ground node through a fourth switch of the first type. The positive terminal of the second sampling capacitor is coupled to the source of the second input signal through a fifth switch of the second type and coupled to a ground node through a sixth switch of the first type. The negative terminal of the second sampling capacitor is coupled to the inverting input of the first OTA through a seventh switch of the second type and coupled to a ground node through an eighth switch of the first type. The positive terminal of the third sampling capacitor is coupled to the source of the first input signal through a ninth switch of the first type and coupled to a ground node through a tenth switch of the second type. The negative terminal of the third sampling capacitor is coupled to the inverting input of the second OTA through an eleventh switch of the second type and coupled to a ground node through a twelfth switch of the first type. The positive terminal of the fourth sampling capacitor is coupled to the source of the second input signal through a thirteenth switch of the second type and coupled to a ground node through a fourteenth switch of the first type. The negative terminal of the fourth sampling capacitor is coupled to the inverting input of the first OTA through a fifteenth switch of the second type and coupled to a ground node through a sixteenth switch of the first type.

The first switch, the fourth switch, the sixth switch, the eighth switch, the ninth switch, the twelfth switch, the fourteenth switch, and the sixteenth switch of the first type may be activated by a first phase ($\Phi_1$) of a sampling clock being active. The second switch, the third switch, the fifth switch, the seventh switch, the tenth switch, the eleventh switch, the thirteenth switch, and the fifteenth switch of the second type may be activated by a second phase ($\Phi_2$) of the sampling clock being active. Moreover, the first phase and the second phase of the sampling clock may be non-overlapping.

In an aspect, in the first mode, the first sampling capacitor, the second sampling capacitor, the first feedback capacitor, and the first OTA are enabled according to switching controlled by the first phase and the second phase of the sampling clock. A signal from the negative terminal of the first sampling capacitor, a signal from the negative terminal of the second sampling capacitor, and a signal from the negative terminal of the first feedback capacitor converge at the inverting input of the first OTA to allow the first OTA to generate the output signal based on the converged signals.

In another aspect, in the second mode, the first sampling capacitor, the second sampling capacitor, the first feedback capacitor, and the first OTA are enabled according to switching controlled by the first phase and the second phase of the sampling clock. The third sampling capacitor, the fourth sampling capacitor, the second feedback capacitor, and the second OTA are also enabled according to switching controlled by the first phase and the second phase of the sampling clock. A signal from the negative terminal of the first sampling capacitor, a signal from the negative terminal of the second sampling capacitor, a signal from the negative terminal of the first feedback capacitor, a signal from the negative terminal of the third sampling capacitor, a signal from the negative terminal of the fourth sampling capacitor, and a signal from the negative terminal of the second feedback capacitor converge at the inverting input of the first OTA and the inverting input of the second OTA. The first OTA generates the first output based on the converged signals and the second OTA generates the second output based on the converged signals, wherein the first output converges with the second output to generate the output signal.

The apparatus for splitting a switched capacitor integrator of a delta-sigma modulator includes first integrating means, second integrating means, wherein the first integrating means and the second integrating means are configured to be coupled in parallel to each other, and means for switching between a first mode and a second mode. In the first mode, the first integrating means is enabled to operate on at least one input signal to generate an output signal. In the second mode, the first integrating means and the second integrating means are enabled to cooperatively operate on the at least one input signal. In the second mode, the first integrating means is configured to generate a first output, the second integrating means is configured to generate a second output, and the first output converges with the second output to generate the output signal. The apparatus includes means for applying the output signal to at least one element of the delta-sigma modulator. The apparatus further includes first delay cell means for receiving the at least one input signal, and second delay cell means for receiving the at least one input signal, wherein the first integrating means is configured to receive at least one of an output of the first delay cell means or an output of the second delay cell means, and wherein the second integrating means is configured to receive the at least one of the output of the first delay cell means or the output of the second delay cell means. The aforementioned means may be one or more of the structural elements described above with respect to FIGS. 4A, 4B, and 5.

Figure 7:
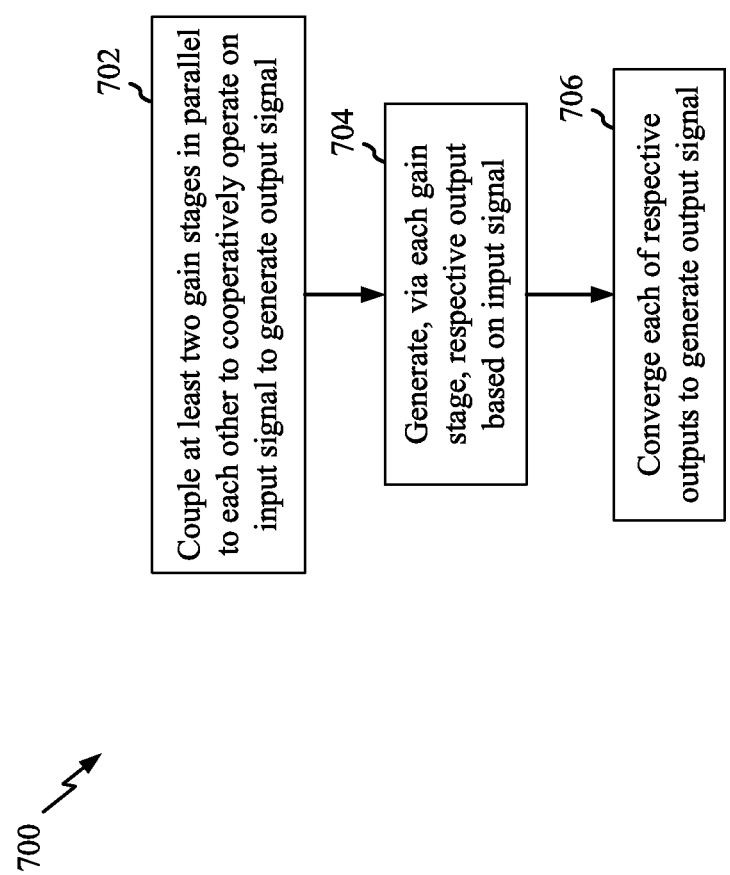
FIG. 7 is a flow chart of a method for splitting a switched capacitor amplifier.

FIG. 7 is a flow chart 700 of a method for splitting a switched capacitor amplifier. The method may be performed by an apparatus (e.g., a switched capacitor amplifier) via one or more of the structural elements described above with respect to FIG. 2.

At block 702, the apparatus couples at least two gain stages in parallel to each other (e.g., multiple parallel gain stages 220). The at least two gain stages cooperatively operate on an input signal to generate an output signal. The output signal may be generated according to blocks 704 and 706.

At block 704, each gain stage of the at least two gain stages generates a respective output based on the input signal. Thereafter, at block 706, the apparatus converges each of the respective outputs to generate the output signal.

In an aspect, each gain stage includes an operational transconductance amplifier (OTA) (e.g., OTA 226(1), . . . , OTA 226(N)), a sampling capacitor (e.g., capacitor 222(1), . . . , capacitor 222(N)) having a positive terminal coupled to a source of the input signal (e.g., Vin) and a negative terminal coupled to an inverting input of the OTA, and a feedback capacitor (e.g., capacitor 224(1), . . . , 224(N)) having a positive terminal coupled to an output of the OTA and a negative terminal coupled to the inverting input of the OTA.

The positive terminal of the sampling capacitor is coupled to a ground node through a first switch of a first type (e.g., first switch type turned on by $\Phi_1$) and coupled to the source of the input signal through a second switch of a second type (e.g., second switch type turned on by $\Phi_2$). The negative terminal of the sampling capacitor is coupled to the ground node through a third switch of the first type. The negative terminal of the feedback capacitor is coupled to the ground node through the third switch of the first type. The positive terminal of the feedback capacitor is coupled to the ground node through a fourth switch of the first type. The inverting input of the OTA is coupled to the ground node through the third switch of the first type. The output of the OTA is coupled to the ground node through the fourth switch of the first type.

The first switch, the third switch, and the fourth switch of the first type may be activated by a first phase ($\Phi_1$) of a sampling clock being active. The second switch of the second type may be activated by a second phase ($\Phi_2$) of the sampling clock being active.

For each gain stage, the sampling capacitor, the feedback capacitor, and the OTA operate according to switching controlled by the first phase and the second phase of the sampling clock. A signal from the negative terminal of the sampling capacitor and a signal from the negative terminal of the feedback capacitor converge at the inverting input of the OTA. Thereafter, the OTA generates the respective output based on the converged signals.

The apparatus for splitting the switched capacitor amplifier includes means for coupling at least two gain stages in parallel to each other to cooperatively operate on an input signal to generate an output signal, means for generating, via each gain stage, a respective output based on the input signal, and means for converging each of the respective outputs to generate the output signal. The aforementioned means may be one or more of the structural elements described above with respect to FIG. 2.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. A switched capacitor integrator of a delta-sigma modulator, comprising:
   a first integrator;
   a second integrator, wherein the first integrator and the second integrator are configured to be coupled in parallel to each other;
   at least one switch configured to switch between a first mode and a second mode,
   wherein in the first mode, the first integrator is enabled to operate on at least one input signal to generate an output signal and the second integrator is disabled from operating on the at least one input signal, and
   wherein in the second mode, the first integrator and the second integrator are enabled to cooperatively operate on the at least one input signal, wherein the first integrator generates a first output, the second integrator generates a second output, and the first output converges with the second output to generate the output signal; and
   a delay cell configured to receive one of the at least one input signal or the output signal, wherein one of the first integrator or the second integrator is configured to receive an output of the delay cell.

2. The switched capacitor integrator of claim 1, wherein the output signal is applied to at least one element of the delta-sigma modulator.

3. A switched capacitor integrator of a delta-sigma modulator, comprising:
   a first integrator;
   a second integrator, wherein the first integrator and the second integrator are configured to be coupled in parallel to each other;
   at least one switch configured to switch between a first mode and a second mode,
   wherein in the first mode, the first integrator is enabled to operate on at least one input signal to generate an output signal, and
   wherein in the second mode, the first integrator and the second integrator are enabled to cooperatively operate on the at least one input signal, wherein the first integrator generates a first output, the second integrator generates a second output, and the first output converges with the second output to generate the output signal;
   a first delay cell configured to receive the at least one input signal; and
   a second delay cell configured to receive the output signal;
   wherein the first integrator is configured to receive at least one of an output of the first delay cell or an output of the second delay cell, and
   wherein the second integrator is configured to receive the at least one of the output of the first delay cell or the output of the second delay cell.

4. The switched capacitor integrator of claim 3, wherein in the first mode, the first integrator is configured to generate the output signal based on the output of the first delay cell.

5. The switched capacitor integrator of claim 3, wherein in the second mode:
   the first integrator is configured to generate the first output based on the output of the first delay cell and the output of the second delay cell; and
   the second integrator is configured to generate the second output based on the output of the first delay cell and the output of the second delay cell.

6. The switched capacitor integrator of claim 3,
   wherein the first integrator comprises:
      a first operational transconductance amplifier (OTA), and
      a first feedback capacitor having a positive terminal coupled to an output of the first OTA and a negative terminal coupled to an inverting input of the first OTA;
   wherein the first delay cell comprises:
      a first sampling capacitor having a positive terminal coupled to a source of a first input signal of the at least one input signal and a negative terminal coupled to the inverting input of the first OTA, and a second sampling capacitor having a positive terminal coupled to a source of a second input signal of the at least one input signal and a negative terminal coupled to the inverting input of the first OTA;

wherein the second integrator comprises:
 a second OTA, and
 a second feedback capacitor having a positive terminal coupled to an output of the second OTA and a negative terminal coupled to an inverting input of the second OTA; and wherein the second delay cell comprises:
 a third sampling capacitor having a positive terminal coupled to the source of the first input signal of the at least one input signal and a negative terminal coupled to the inverting input of the second OTA, and
 a fourth sampling capacitor having a positive terminal coupled to the source of the second input signal of the at least one input signal and a negative terminal coupled to the inverting input of the second OTA.

7. The switched capacitor integrator of claim 6,
 wherein the positive terminal of the first sampling capacitor is coupled to the source of the first input signal through a first switch of a first type and coupled to a ground node through a second switch of a second type;
 wherein the negative terminal of the first sampling capacitor is coupled to the inverting input of the first OTA through a third switch of the second type and coupled to a ground node through a fourth switch of the first type;
 wherein the positive terminal of the second sampling capacitor is coupled to the source of the second input signal through a fifth switch of the second type and coupled to a ground node through a sixth switch of the first type;
 wherein the negative terminal of the second sampling capacitor is coupled to the inverting input of the first OTA through a seventh switch of the second type and coupled to a ground node through an eighth switch of the first type;
 wherein the positive terminal of the third sampling capacitor is coupled to the source of the first input signal through a ninth switch of the first type and coupled to a ground node through a tenth switch of the second type;
 wherein the negative terminal of the third sampling capacitor is coupled to the inverting input of the second OTA through an eleventh switch of the second type and coupled to a ground node through a twelfth switch of the first type;
 wherein the positive terminal of the fourth sampling capacitor is coupled to the source of the second input signal through a thirteenth switch of the second type and coupled to a ground node through a fourteenth switch of the first type; and
 wherein the negative terminal of the fourth sampling capacitor is coupled to the inverting input of the first OTA through a fifteenth switch of the second type and coupled to a ground node through a sixteenth switch of the first type.

8. The switched capacitor integrator of claim 7,
 wherein the first switch, the fourth switch, the sixth switch, the eighth switch, the ninth switch, the twelfth switch, the fourteenth switch, and the sixteenth switch of the first type are activated by a first phase of a sampling clock being active;
 wherein the second switch, the third switch, the fifth switch, the seventh switch, the tenth switch, the eleventh switch, the thirteenth switch, and the fifteenth switch of the second type are activated by a second phase of the sampling clock being active; and
 wherein the first phase and the second phase of the sampling clock are non-overlapping.

9. The switch capacitor integrator of claim 8, wherein in the first mode:
 the first sampling capacitor, the second sampling capacitor, the first feedback capacitor, and the first OTA operate according to switching controlled by the first phase and the second phase of the sampling clock,
 a signal from the negative terminal of the first sampling capacitor, a signal from the negative terminal of the second sampling capacitor, and a signal from the negative terminal of the first feedback capacitor converge at the inverting input of the first OTA, and
 the first OTA generates the output signal based on the converged signals.

10. The switch capacitor integrator of claim 8, wherein in the second mode:
 the first sampling capacitor, the second sampling capacitor, the first feedback capacitor, and the first OTA operate according to switching controlled by the first phase and the second phase of the sampling clock,
 the third sampling capacitor, the fourth sampling capacitor, the second feedback capacitor, and the second OTA operate according to switching controlled by the first phase and the second phase of the sampling clock,
 a signal from the negative terminal of the first sampling capacitor, a signal from the negative terminal of the second sampling capacitor, a signal from the negative terminal of the first feedback capacitor, a signal from the negative terminal of the third sampling capacitor, a signal from the negative terminal of the fourth sampling capacitor, and a signal from the negative terminal of the second feedback capacitor converge at the inverting input of the first OTA and the inverting input of the second OTA,
 the first OTA generates the first output based on the converged signals,
 the second OTA generates the second output based on the converged signals, and
 the first output converges with the second output to generate the output signal.

11. A method for splitting a switched capacitor integrator of a delta-sigma modulator, comprising:
 coupling a first integrator in parallel to a second integrator;
 switching between a first mode and a second mode;
 enabling the first integrator to operate on at least one input signal to generate an output signal in the first mode;
 disabling the second integrator from operating on the at least one input signal in the first mode;
 enabling the first integrator and the second integrator to cooperatively operate on the at least one input signal in the second mode, wherein in the second mode, the method further comprises:
  generating a first output via the first integrator,
  generating a second output via the second integrator, and
  converging the first output with the second output to generate the output signal;

receiving, by a delay cell, one of the at least one input signal or the output signal; and receiving, by one of the first integrator or the second integrator, an output of the delay cell.

12. The method of claim 11, further comprising applying the output signal to at least one element of the delta-sigma modulator.

13. A method for splitting a switched capacitor integrator of a delta-sigma modulator, comprising:

coupling a first integrator in parallel to a second integrator;

switching between a first mode and a second mode;

enabling the first integrator to operate on at least one input signal to generate an output signal in the first mode;

enabling the first integrator and the second integrator to cooperatively operate on the at least one input signal in the second mode, wherein in the second mode, the method further comprises:

generating a first output via the first integrator, generating a second output via the second integrator, and converging the first output with the second output to generate the output signal;

receiving, via a first delay cell, the at least one input signal;

receiving, via a second delay cell, the output signal;

receiving, via the first integrator, at least one of an output of the first delay cell or an output of the second delay cell; and receiving, via the second integrator, the at least one of the output of the first delay cell or the output of the second delay cell.

14. The method of claim 13, wherein in the first mode, the first integrator is configured to generate the output signal based on the output of the first delay cell.

15. The method of claim 13, wherein in the second mode:

the first integrator is configured to generate the first output based on the output of the first delay cell and the output of the second delay cell; and the second integrator is configured to generate the second output based on the output of the first delay cell and the output of the second delay cell.

16. The method of claim 15, wherein the first integrator comprises:
a first operational transconductance amplifier (OTA), and
a first feedback capacitor having a positive terminal coupled to an output of the first OTA and a negative terminal coupled to an inverting input of the first OTA;

wherein the first delay cell comprises:
a first sampling capacitor having a positive terminal coupled to a source of a first input signal of the at least one input signal and a negative terminal coupled to the inverting input of the first OTA, and
a second sampling capacitor having a positive terminal coupled to a source of a second input signal of the at least one input signal and a negative terminal coupled to the inverting input of the first OTA;

wherein the second integrator comprises:
a second OTA, and
a second feedback capacitor having a positive terminal coupled to an output of the second OTA and a negative terminal coupled to an inverting input of the second OTA; and wherein the second delay cell comprises:
a third sampling capacitor having a positive terminal coupled to the source of the first input signal of the at least one input signal and a negative terminal coupled to the inverting input of the second OTA, and
a fourth sampling capacitor having a positive terminal coupled to the source of the second input signal of the at least one input signal and a negative terminal coupled to the inverting input of the second OTA.

17. The method of claim 16, wherein the positive terminal of the first sampling capacitor is coupled to the source of the first input signal through a first switch of a first type and coupled to a ground node through a second switch of a second type;

wherein the negative terminal of the first sampling capacitor is coupled to the inverting input of the first OTA through a third switch of the second type and coupled to a ground node through a fourth switch of the first type;

wherein the positive terminal of the second sampling capacitor is coupled to the source of the second input signal through a fifth switch of the second type and coupled to a ground node through a sixth switch of the first type;

wherein the negative terminal of the second sampling capacitor is coupled to the inverting input of the first OTA through a seventh switch of the second type and coupled to a ground node through an eighth switch of the first type;

wherein the positive terminal of the third sampling capacitor is coupled to the source of the first input signal through a ninth switch of the first type and coupled to a ground node through a tenth switch of the second type;

wherein the negative terminal of the third sampling capacitor is coupled to the inverting input of the second OTA through an eleventh switch of the second type and coupled to a ground node through a twelfth switch of the first type;

wherein the positive terminal of the fourth sampling capacitor is coupled to the source of the second input signal through a thirteenth switch of the second type and coupled to a ground node through a fourteenth switch of the first type; and wherein the negative terminal of the fourth sampling capacitor is coupled to the inverting input of the first OTA through a fifteenth switch of the second type and coupled to a ground node through a sixteenth switch of the first type.

18. The method of claim 17, wherein the first switch, the fourth switch, the sixth switch, the eighth switch, the ninth switch, the twelfth switch, the fourteenth switch, and the sixteenth switch of the first type are activated by a first phase of a sampling clock being active;

wherein the second switch, the third switch, the fifth switch, the seventh switch, the tenth switch, the eleventh switch, the thirteenth switch, and the fifteenth switch of the second type are activated by a second phase of the sampling clock being active; and wherein the first phase and the second phase of the sampling clock are non-overlapping.

19. The method of claim 18, wherein in the first mode:

the first sampling capacitor, the second sampling capacitor, the first feedback capacitor, and the first OTA are enabled according to switching controlled by the first phase and the second phase of the sampling clock, a signal from the negative terminal of the first sampling capacitor, a signal from the negative terminal of the second sampling capacitor, and a signal from the negative terminal of the first feedback capacitor converge at the inverting input of the first OTA, and the first OTA generates the output signal based on the converged signals.

20. The method of claim 18, wherein in the second mode:

the first sampling capacitor, the second sampling capacitor, the first feedback capacitor, and the first OTA are enabled according to switching controlled by the first phase and the second phase of the sampling clock, the third sampling capacitor, the fourth sampling capacitor, the second feedback capacitor, and the second OTA are enabled according to switching controlled by the first phase and the second phase of the sampling clock, a signal from the negative terminal of the first sampling capacitor, a signal from the negative terminal of the second sampling capacitor, a signal from the negative terminal of the first feedback capacitor, a signal from the negative terminal of the third sampling capacitor, a signal from the negative terminal of the fourth sampling capacitor, and a signal from the negative terminal of the second feedback capacitor converge at the inverting input of the first OTA and the inverting input of the second OTA, the first OTA generates the first output based on the converged signals, the second OTA generates the second output based on the converged signals, and the first output converges with the second output to generate the output signal.

21. An apparatus for splitting a switched capacitor integrator of a delta-sigma modulator, comprising:

first integrating means;

second integrating means, wherein the first integrating means and the second integrating means are configured to be coupled in parallel to each other;

means for switching between a first mode and a second mode, wherein in the first mode, the first integrating means is enabled to operate on at least one input signal to generate an output signal and the second integrating means is further configured to be disabled from operating on the at least one input signal, and wherein in the second mode, the first integrating means and the second integrating means are enabled to cooperatively operate on the at least one input signal, wherein the first integrating means is configured to generate a first output, the second integrating means is configured to generate a second output, and the first output converges with the second output to generate the output signal; and a delay cell configured to receive one of the at least one input signal or the output signal, wherein one of the first integrating means or the second integrating means receives an output of the delay cell.

22. The apparatus of claim 21, further comprising means for applying output signal to at least one element of the delta-sigma modulator.

23. An apparatus for splitting a switched capacitor integrator of a delta-sigma modulator, comprising:

first integrating means;

second integrating means, wherein the first integrating means and the second integrating means are configured to be coupled in parallel to each other;

means for switching between a first mode and a second mode, wherein in the first mode, the first integrating means is enabled to operate on at least one input signal to generate an output signal, and wherein in the second mode, the first integrating means and the second integrating means are enabled to cooperatively operate on the at least one input signal, wherein the first integrating means is configured to generate a first output, the second integrating means is configured to generate a second output, and the first output converges with the second output to generate the output signal;

first delay cell means for receiving the at least one input signal;

second delay cell means for receiving the output signal, wherein the first integrating means is configured to receive an output of the first delay cell means and receive an output of the second delay cell means, and wherein the second integrating means is configured to receive the output of the first delay cell means and receive the output of the second delay cell means.

24. The apparatus of claim 23, wherein in the first mode, the first integrating means is configured to generate the output signal based on the output of the first delay cell means and the output of the second delay cell means.

25. The apparatus of claim 23, wherein in the second mode:

the first integrating means is configured to generate the first output based on the output of the first delay cell means and the output of the second delay cell means; and the second integrating means is configured to generate the second output based on the output of the first delay cell means and the output of the second delay cell means.

26. An apparatus for splitting a switched capacitor amplifier, comprising:

at least two gain stages coupled in parallel to each other, wherein the at least two gain stages cooperatively operate on an input signal to generate an output signal by:

generating, vie each stage, a respective output based on the input signal, and converging each of the respective outputs to generate the output signal, wherein each gain stage comprises:

an operational transconductance amplifier (OTA);

a sampling capacitor having a positive terminal coupled to a source of the input signal and a negative terminal coupled to an inverting input of the OTA; and a feedback capacitor having a positive terminal coupled to an output of the OTA and a negative terminal coupled to the inverting input of the OTA.

27. The apparatus of claim 26, wherein the positive terminal of the sampling capacitor is coupled to a ground node through a first switch of a first type and coupled to the source of the input signal through a second switch of a second type;

wherein the negative terminal of the sampling capacitor is coupled to the ground node through a third switch of the first type;

wherein the negative terminal of the feedback capacitor is coupled to the ground node through the third switch of the first type;

wherein the positive terminal of the feedback capacitor is coupled to the ground node through a fourth switch of the first type, wherein the inverting input of the OTA is coupled to the ground node through the third switch of the first type; and wherein the output of the OTA is coupled to the ground node through the fourth switch of the first type.

28. The apparatus of claim 27, wherein the first switch, the third switch, and the fourth switch of the first type are activated by a first phase of a sampling clock being active; and wherein the second switch of the second type is activated by a second phase of the sampling clock being active.

29. The apparatus of claim 28, wherein for each gain stage:

the sampling capacitor, the feedback capacitor, and the OTA operate according to switching controlled by the first phase and the second phase of the sampling clock;

a signal from the negative terminal of the sampling capacitor and a signal from the negative terminal of the feedback capacitor converge at the inverting input of the OTA; and the OTA generates the respective output based on the converged signals.

* * * * *